(12) United States Patent
Kim et al.

(10) Patent No.: US 11,616,170 B2
(45) Date of Patent: Mar. 28, 2023

(54) LIGHT EMITTING DEVICE

(71) Applicant: SAMSUNG ELECTRONICS CO., LTD., Suwon-si (KR)

(72) Inventors: Taehun Kim, Bucheon-si (KR); Dongmyung Shin, Seoul (KR); Minho Kim, Hwaseong-si (KR); Minwook Choi, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 169 days.

(21) Appl. No.: 16/940,879

(22) Filed: Jul. 28, 2020

(65) Prior Publication Data
US 2021/0217929 A1    Jul. 15, 2021

(30) Foreign Application Priority Data
Jan. 15, 2020    (KR) .................. 10-2020-0005149

(51) Int. Cl.
*H01L 33/38* (2010.01)
*H01L 33/44* (2010.01)
*H01L 33/62* (2010.01)
*H01L 33/42* (2010.01)

(52) U.S. Cl.
CPC .............. *H01L 33/38* (2013.01); *H01L 33/44* (2013.01); *H01L 33/42* (2013.01); *H01L 33/62* (2013.01); *H01L 2933/0016* (2013.01)

(58) Field of Classification Search
CPC ......... H01L 33/38; H01L 33/44; H01L 33/42; H01L 33/62
See application file for complete search history.

(56) References Cited

U.S. PATENT DOCUMENTS

| | | | |
|---|---|---|---|
| 7,375,380 B2 | 5/2008 | Asahara et al. |
| 8,507,942 B2 | 8/2013 | Min |
| 8,779,441 B2 | 7/2014 | Okabe |
| 9,203,054 B2 | 12/2015 | Hirasawa et al. |
| | (Continued) | | |

FOREIGN PATENT DOCUMENTS

| | | |
|---|---|---|
| JP | 3448441 B2 | 9/2003 |
| KR | 101941032 B1 | 1/2019 |

*Primary Examiner* — Su C Kim
(74) *Attorney, Agent, or Firm* — Sughrue Mion, PLLC

(57) ABSTRACT

A light emitting device may include a light emitting structure, a transparent electrode, a first insulation layer, a first electrode, a second insulation layer and a second electrode. The light emitting structure may include a first semiconductor layer, an activation layer and a second semiconductor layer sequentially stacked. The transparent electrode may be formed on an upper surface of the second semiconductor layer. The transparent electrode may have at least one opening. The first insulation layer may be formed on an upper surface of the transparent electrode to fill the at least one opening. The first electrode may be formed on an upper surface of the first insulation layer. The first electrode may include a contact extending through the first insulation layer and connected with the transparent electrode. The second insulation layer may be formed on an upper surface of the first electrode. The second electrode may be formed on an upper surface of the second insulation layer. The second electrode may be electrically connected with the first semiconductor layer.

20 Claims, 18 Drawing Sheets

(56) References Cited

U.S. PATENT DOCUMENTS

| | | | |
|---|---|---|---|
| 10,622,520 B2* | 4/2020 | Yoon | H01L 33/20 |
| 2012/0060909 A1 | 3/2012 | Nagata et al. | |
| 2017/0162745 A1 | 6/2017 | Moriyasu et al. | |
| 2017/0365745 A1* | 12/2017 | Yang | H01L 33/44 |
| 2018/0145224 A1* | 5/2018 | Kim | H01L 33/0075 |

* cited by examiner

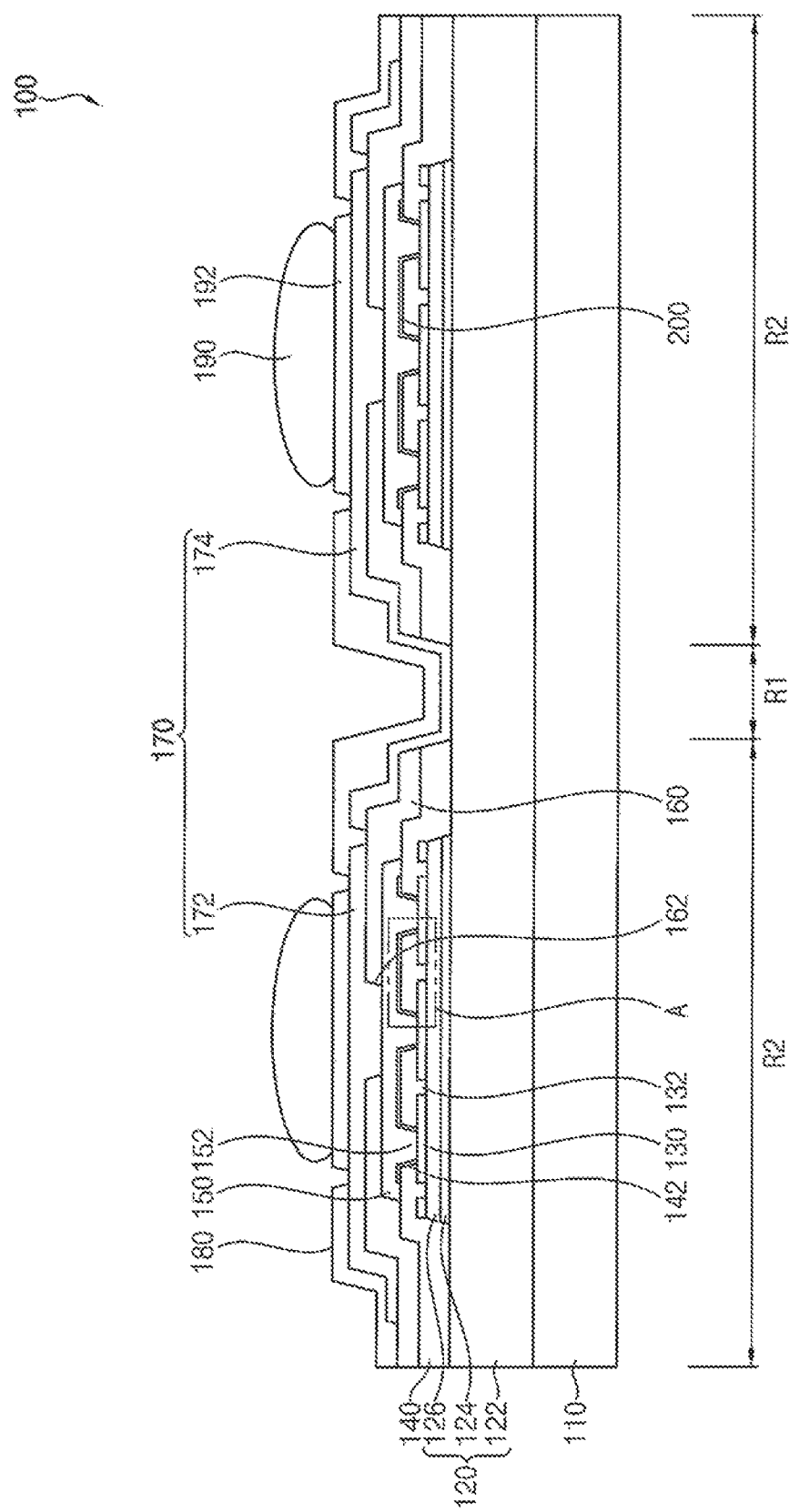

LIGHT EMITTING DEVICE

CROSS-REFERENCE TO RELATED APPLICATION

This application is based on and claims priority under 35 USC § 119 to Korean Patent Application No. 10-2020-0005149, filed on Jan. 15, 2020, in the Korean Intellectual Property Office, the disclosure of which is incorporated by reference herein in its entirety.

BACKGROUND

1. Field

The disclosure relates to a light emitting device. More particularly, example embodiments relate to a flip-chip type or a vertical type light emitting device.

2. Description of Related Art

Generally, a light emitting device (LED) may include a first semiconductor layer, an activation layer, a second semiconductor layer and a transparent electrode sequentially stacked. A first electrode may be electrically connected to the first semiconductor layer. A second electrode may be arranged over the transparent electrode.

According to related arts, in order to optimize light extraction efficiency of a flip-chip type LED or a vertical LED, an insulation layer may be interposed between the transparent electrode and the second electrode.

However, a whole surface of the transparent electrode may be configured to make contact with the second semiconductor layer so that the transparent electrode may have a high light absorptivity. This may cause a low light extraction efficiency of the LED.

SUMMARY

Example embodiments provide a light emitting device having improved light extraction efficiency.

In accordance with an aspect of the disclosure, a light emitting device (LED) includes a light emitting structure including a first semiconductor layer, an activation layer and a second semiconductor layer sequentially stacked; a transparent electrode formed on an upper surface of the second semiconductor layer, the transparent electrode having at least one opening; a first insulation layer formed on an upper surface of the transparent electrode to fill the at least one opening; a first electrode formed on an upper surface of the first insulation layer, the first electrode including a contact extending through the first insulation layer, the contact being connected with the transparent electrode; a second insulation layer formed on an upper surface of the first electrode; and a second electrode formed on an upper surface of the second insulation layer, the second electrode being electrically connected with the first semiconductor layer.

The at least one opening may include a first opening having a fully opened structure, the first opening having a depth substantially equal to a thickness of the transparent electrode to expose the upper surface of the second semiconductor layer.

A ratio of a diameter of the first opening to the thickness of the transparent electrode may be in a range from 5,000:50 to 5,000:15.

The at least one opening may further include a second opening having a partially opened structure, the second opening having a depth less than the thickness of the transparent electrode, and the transparent electrode may include a connection arranged on a bottom surface of the second opening to connect portions of the transparent electrode around the second opening with each other.

The second opening may have a volume substantially equal to a volume of the first opening.

The at least one opening may include a second opening having a partially opened structure, the second opening having a depth less than a thickness of the transparent electrode, and the transparent electrode may include a connection arranged on a bottom surface of the second opening to connect portions of the transparent electrode around the second opening with each other.

A cross-sectional area of the connection may be substantially equal to a cross-sectional area of the second opening.

A ratio of a diameter of the second opening to the thickness of the transparent electrode may be in a range from 5,000:15 to 10,000:15, and a ratio of a thickness of the connection to the thickness of the transparent electrode may be in a range from 5:15 to 10:15.

The transparent electrode may include a lower transparent electrode layer formed on the upper surface of the second semiconductor layer; and an upper transparent electrode layer formed on an upper surface of the lower transparent electrode layer, the upper transparent electrode layer having the second opening.

The first insulation layer may include a plurality of contact holes in which the contact is formed, and the at least one opening may be arranged between adjacent contact holes among the plurality of contact holes.

The LED may further include an adhesive layer interposed between the first insulation layer and the first electrode.

The adhesive layer may have at least one second opening configured to expose the upper surface of the first insulation layer and a lower surface of the first electrode.

The light emitting structure may include a first region in which the upper surface of the first semiconductor layer is exposed; and a second region including the first semiconductor layer, the activation layer and the second semiconductor layer.

The LED may further include a growth substrate arranged under the first semiconductor layer, wherein the second electrode includes a first electrode layer configured to make electrical contact with the first semiconductor layer exposed in the first region and a second electrode layer electrically connected to the first electrode.

In accordance with an aspect of the disclosure, a light emitting device (LED) includes a first semiconductor layer; an activation layer formed on an upper surface of the first semiconductor layer; a second semiconductor layer formed on an upper surface of the activation layer; a transparent electrode formed on an upper surface of the second semiconductor layer, the transparent electrode having at least one opening, the at least one opening having a depth through which the upper surface of the second semiconductor layer is not exposed; a first insulation layer formed on an upper surface of the transparent electrode to fill the at least one opening; a first electrode formed on an upper surface of the first insulation layer, the first electrode including a contact extending through the first insulation layer, the contact being connected with the transparent electrode; a second insulation layer formed on an upper surface of the first electrode; and a second electrode formed on an upper surface of the second insulation layer, the second electrode being electrically connected with the first semiconductor layer, wherein a ratio of a diameter of the at least one opening to a thickness of the transparent electrode is in a range from 5,000:15 to 10,000:15.

The transparent electrode may include a connection arranged on a bottom surface of the at least one opening to connect portions of the transparent electrode around the at least one opening with each other.

A ratio of a thickness of the connection to the thickness of the transparent electrode may be in a range from 5:15 to 10:15.

The transparent electrode may include a lower transparent electrode layer formed on the upper surface of the second semiconductor layer; and an upper transparent electrode layer formed on an upper surface of the lower transparent electrode layer, the upper transparent electrode layer having the at least one opening.

The LED may further include an adhesive layer interposed between the first insulation layer and the first electrode.

The adhesive layer may have at least one second opening configured to expose the upper surface of the first insulation layer and a lower surface of the first electrode.

BRIEF DESCRIPTION OF THE DRAWINGS

The above and other aspects, features, and advantages of certain embodiments of the disclosure will be more apparent from the following description taken in conjunction with the accompanying drawings, in which:

FIG. 1 is a cross-sectional view illustrating a light emitting device (LED) according to an embodiment;

DETAILED DESCRIPTION OF EMBODIMENTS

Hereinafter, example embodiments will be explained in detail with reference to the accompanying drawings.

Figure 2A:
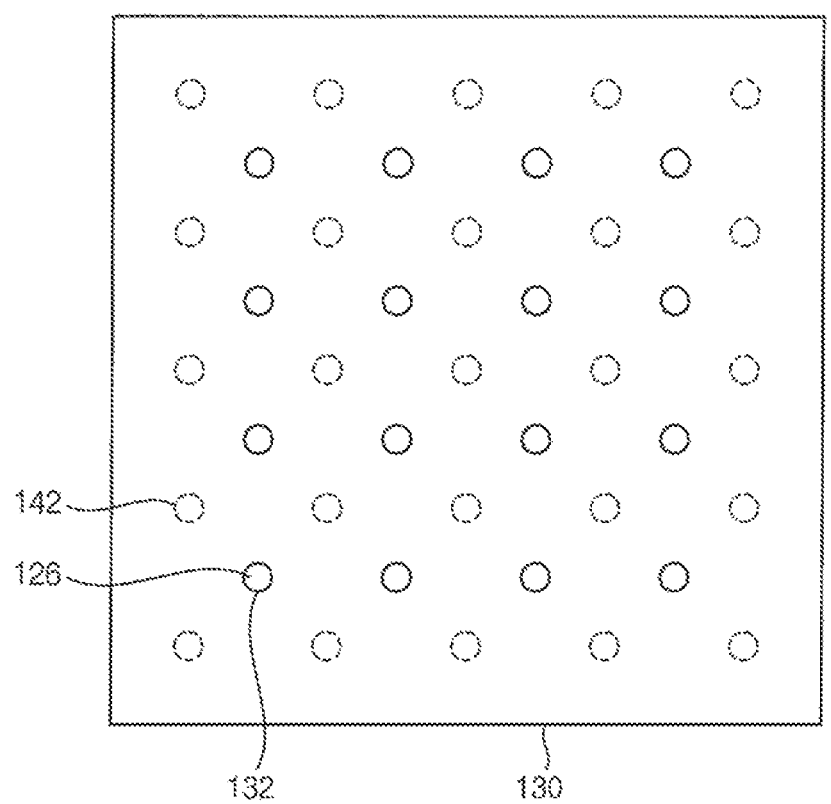
FIGS. 2A to 2C are plan views illustrating example transparent electrodes of the LED in FIG. 1.
Figure 2B:
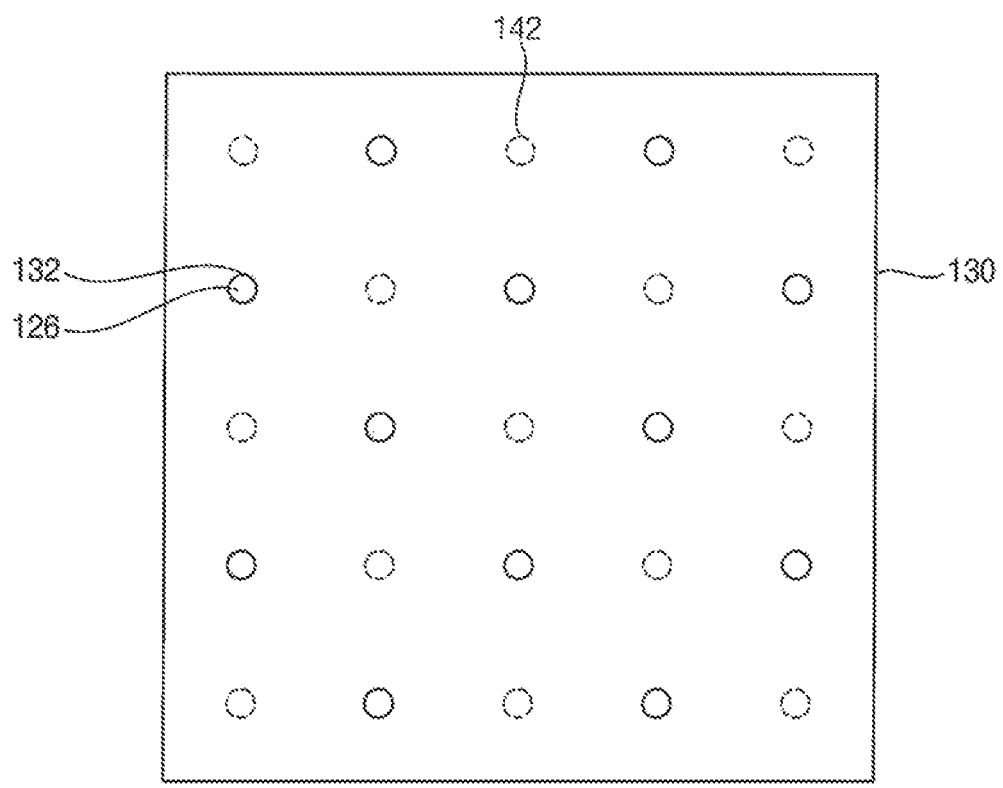
Figure 2C:
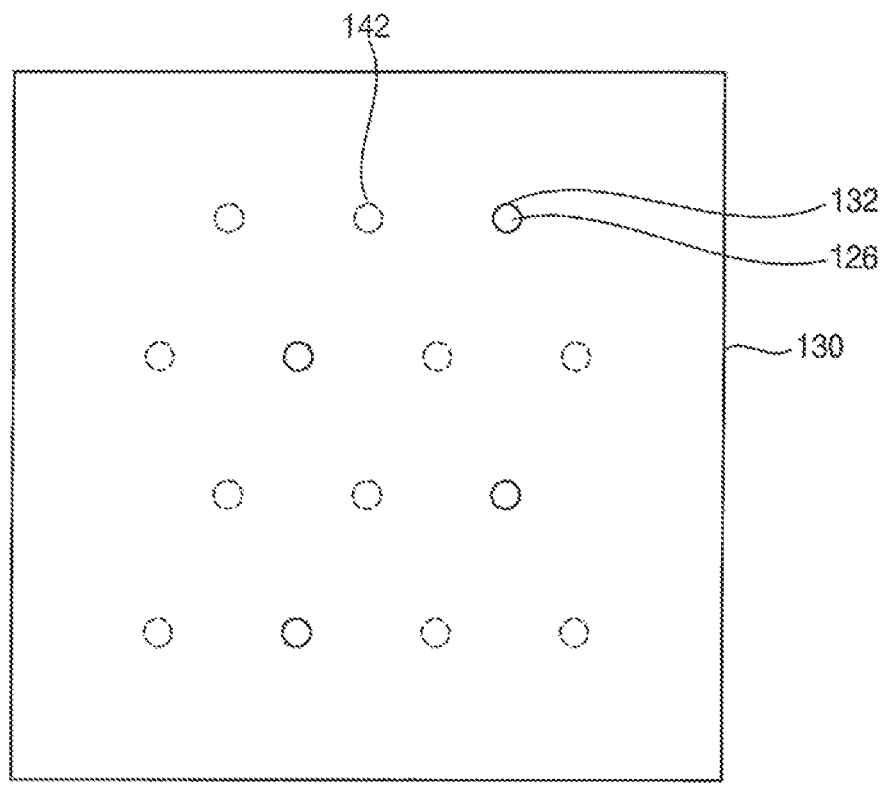
Figure 3:
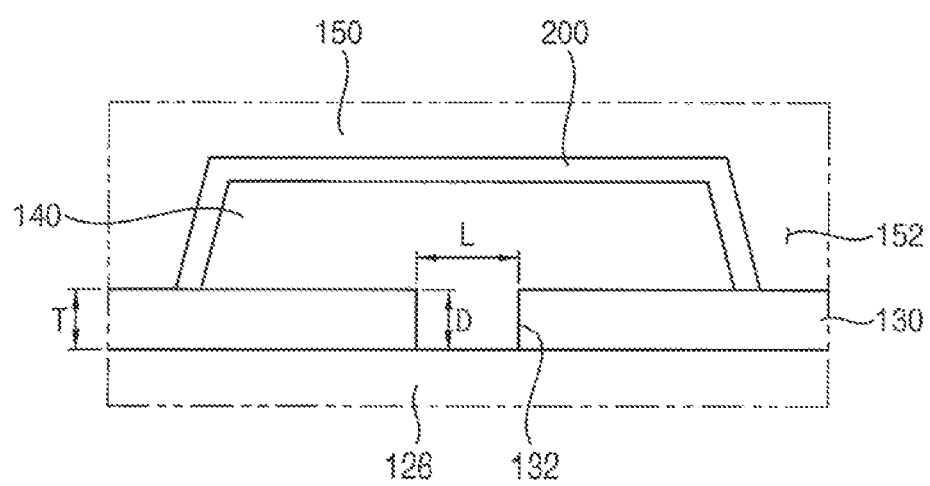
FIG. 3 is an enlarged cross-sectional view of a portion "A" in FIG. 1.

FIG. 1 is a cross-sectional view illustrating a light emitting device (LED) in accordance with example embodiments, FIGS. 2A to 2C are plan views illustrating example transparent electrodes of the LED in FIG. 1, and FIG. 3 is an enlarged cross-sectional view of a portion "A" in FIG. 1.

Referring to FIGS. 1 to 3, a light emitting device (LED) 100 of example embodiments may have a flip-chip structure. The flip-chip type LED 100 may include a growth substrate 110, a light emitting structure 120, a transparent electrode 130, a first insulation layer 140, a first electrode 150, a second insulation layer 160, a second electrode 170, a third insulation layer 180 and an adhesive layer 200.

The growth substrate 110 may include a sapphire ($Al_2O_3$) substrate, an SiC substrate, etc. However, the growth substrate 110 may include other materials besides the above-mentioned materials.

The light emitting structure 120 may be arranged on an upper surface of the growth substrate 110. The light emitting structure 120 may include a first semiconductor layer 122, an activation layer 124 and a second semiconductor layer 126 sequentially stacked. That is, the first semiconductor layer 122 may be formed on the upper surface of the growth substrate 110. The activation layer 124 may be formed on an upper surface of the first semiconductor layer 122. The second semiconductor layer 126 may be formed on an upper surface of the activation layer 124.

The first semiconductor layer 122 may include an N type semiconductor layer. For example, the first semiconductor layer 122 may include GaN, InN, AlN, InGaN, InAlGaN, AlInN, AlGaAs, InGaAs, AlInGaAs, GaP, AlGaP, InGaP, AlInGaP, InP, etc.

The activation layer 124 may have a quantum well structure formed by stacking semiconductor layers having different energy bands. For example, the activation layer 124 may include InGaN/GaN, InGaN/InGaN, AlGaN/GaN, InAlGaN/GaN, GaAs/AlGaAs(InGaAs), GaP/AlGaP(InGaP), etc.

The second semiconductor layer 126 may include a P type semiconductor layer. For example, the second semiconductor layer 126 may include InAlGaN, GaN, AlGaN, InGaN, AlN, InN, etc.

The light emitting structure 120 may have a first region R1 and a second region R2. The first region R1 may correspond to an etched region of the light emitting structure 120 configured to expose the upper surface of the first semiconductor layer 122 by etching the second semiconductor layer 126 and the activation layer 124. Thus, only the first semiconductor layer 122 of the light emitting structure 120 may be included in the first region R1. In contrast, the second region R2 may correspond to a mesa region of the light emitting structure 120 that may not be etched during the forming of the first region R1. Thus, the first semiconductor layer 122, the activation layer 124 and the second semiconductor layer 126 may be included in the second region R2.

The transparent electrode 130 may be formed on an upper surface of the second semiconductor layer 126. The transparent electrode 130 may have a thickness T of about 15 nm to about 50 nm as shown in FIG. 3. The transparent electrode 130 may include indium tin oxide (ITO), ZnO, IZO, etc. In order to increase light extraction efficiency of the flip-chip type LED 100, it may be required to decrease a light absorptivity of the transparent electrode 130. A structure for decreasing the light absorptivity of the transparent electrode 130 may be illustrated later.

The first insulation layer 140 may be formed on an upper surface of the transparent electrode 130. The first insulation layer 140 may include first contact holes 142 configured to partially expose the upper surface of the transparent electrode 130. The first contact holes 142 may correspond to a P type contact hole. The first insulation layer 130 may include an insulation material such as silicon oxide, silicon oxynitride, silicon nitride, etc. The first insulation layer 140 may include an Omni-directional reflector (ODR) for increasing a reflectivity. Alternatively, the first insulation layer 140 may include a distributed Bragg reflector (DBR) that may be formed by alternately stacking a plurality of insulation layers having different refractivities.

The first electrode 150 may be formed on an upper surface of the first insulation layer 140. The first electrode 150 may include first contacts 152 configured to fill the first contact holes 142 of the first insulation layer 140. The first contacts 152 may make contact with the upper surface of the transparent electrode 130 exposed through the first contact holes 142. Thus, the first electrode 150 may be electrically connected with the second semiconductor layer 126 through the first contacts 152 and the transparent electrode 130. The first electrode 150 may include titanium (Ti), chrome (Cr), nickel (Ni), aluminum (Al), platinum (Pt), gold (Au), tungsten (W), silver (Ag), ITO, etc.

The adhesive layer 200 may be interposed between the first insulation layer 140 and the first electrode 150. The adhesive layer 200 may function as to reinforce an adhesion force between the first insulation layer 140 and the first electrode 150. The adhesive layer 200 may include transparent conductive oxide.

In order to reduce the light absorptivity of the transparent electrode 130, the transparent electrode 130 may include at least one first opening 132. The first opening 132 may be formed to extend from an upper surface of the transparent electrode 130 to a lower surface of the transparent electrode 130. Thus, the first opening 132 may have a fully opened structure configured to expose the upper surface of the second semiconductor layer 126 under the first opening 132. The first opening 132 may be positioned between the first contact holes 142. Further, at least two first openings 132 may be formed between the first contact holes 142. The first opening 132 may be filled with the first insulation layer 140.

In example embodiments, the first opening 132 may have a circular shape. However, the first opening 132 may have other shapes such as a triangular shape, a quadrangular shape, etc. Because the first opening 132 may have the fully opened structure configured to expose the upper surface of the second semiconductor layer 126, the first opening 132 may have a depth D substantially the same as the thickness T of the transparent electrode 130 as shown in FIG. 3.

Further, the first opening 132 may have a diameter L. The diameter L of the first opening 132 may be about 5,000/50 times to about 5,000/15 times the thickness T of the transparent electrode 130. In other words, a ratio of the diameter L of the first opening 132 to the thickness T of the transparent electrode 130 may be about 5,000:50 to about 5,000:15. Thus, the first opening 132 may have a volume V defined by the depth D and the diameter L. A volume of the transparent electrode 130 may be decreased by the volume V of the first opening 132 to reduce the light absorptivity of the transparent electrode 130. As a result, the flip-chip type LED 100 may have improved light extraction efficiency.

On the other hand, the transparent electrode 130 is not present in the first opening 132. Thus, portions of the transparent electrode 130 configured to surround the first opening 132 may not be electrically connected with each other through the first opening 132. That is, the first opening 132 may function as an insulator of the transparent electrode 130. Therefore, the transparent electrode 130 with the first opening 132 may have a current spreading slightly lower than a current spreading of a transparent electrode without the first opening 132. As a result, the flip-chip type LED 100 with the first opening 132 may have a forward voltage Vf slightly higher than a forward voltage of a flip-chip LED without the first opening 132.

Referring to FIG. 2A, the first contact holes 142 of the first insulation layer 140 may be arranged spaced apart from each other by a uniform gap in a first direction and a second direction substantially perpendicular to the first direction. Thus, adjacent four first contact holes 142 among the total first contact holes 142 may form a square shape.

The first openings 132 of the transparent electrode 130 may be arranged in the adjacent four first contact holes 142 configured to form the square shape. In other words, the first openings 132 may be positioned within adjacent square shapes formed by the first contact holes 142. Particularly, the first opening 132 may be positioned at a central portion of the square shape formed by the adjacent four first contact holes 142. Thus, the first openings 132 may be arranged in a direction substantially parallel to a diagonal direction of the transparent electrode 130.

Referring to FIG. 2B, the first contact holes 142 of the first insulation layer 140 may be arranged in a direction substantially parallel to a diagonal direction of the first insulation layer 140. Thus, adjacent four first contact holes 142 among the total first contact holes 142 may form a rhombus shape.

The first openings 132 of the transparent electrode 130 may be arranged in the adjacent four first contact holes 142 configured to form the rhombus shape. In other words, the first openings 132 may be positioned within adjacent rhombus shapes formed by the first contact holes 142. Particularly, the first opening 132 may be positioned at a central portion of the rhombus shape formed by the adjacent four first contact holes 142. Thus, the first openings 132 may be arranged between the first contact holes 142 arranged in the first and second directions.

Referring to FIG. 2C, adjacent six first contact holes 142 among the total first contact holes 142 may form a regular hexagonal shape. The first openings 132 of the transparent electrode 130 may be arranged in the adjacent six first contact holes 142 configured to form the regular hexagonal shape. In other words, the first openings 132 may be positioned within adjacent regular hexagonal shapes formed by the first contact holes 142. Particularly, the first opening 132 may be positioned at a central portion of the regular hexagonal shape formed by the adjacent six first contact holes 142.

In example embodiments, one first opening 132 may be arranged within the shape formed by the adjacent first contact holes 142. Alternatively, at least two first openings 132 may be arranged within the shape formed by the adjacent first contact holes 142. Further, the first opening 132 may be positioned at the central portion of the adjacent first contact holes 142. Alternatively, locations of the first opening 132 between the adjacent first contact holes 142 may not be restricted within a specific position. That is, the above-mentioned functions may be shown by forming the first opening 132 at other locations of the transparent electrode 130 between the first contact holes 142 besides the central portion.

The second insulation layer 160 may be formed on the upper surface of the first electrode 150. The second insulation layer 160 may include second contact holes 162 configured to partially expose the upper surface of the first electrode 150.

The second electrode 170 may be formed on an upper surface of the second insulation layer 160. The second electrode 170 may include a first electrode layer 172 and a second electrode layer 174. The first electrode layer 172 may electrically make contact with the first electrode 150 exposed through the second contact hole 162. The second electrode layer 174 may electrically make contact with the first semiconductor layer 122 exposed through the first region R1. The first electrode layer 172 may be electrically isolated from the second electrode layer 174. The second electrode 170 may include titanium (Ti), chrome (Cr), nickel (Ni), aluminum (Al), platinum (Pt), gold (Au), tungsten (W), silver (Ag), ITO, etc.

The third insulation layer 180 may be formed on an upper surface of the second electrode 170. The third insulation layer 180 may include openings configured to partially expose the second electrode 170. The third insulation layer 180 may correspond to a passivation layer.

A conductive bump 190 may be formed on the second electrode 170 exposed through the opening of the third insulation layer 180. The conductive bump 190 may include a metal, a solder, etc. In order to prevent the solder in the conductive bump 190 from infiltrating into the second electrode 170, a barrier layer 192 may be interposed between the conductive bump 190 and the second electrode 170.

FIGS. 4 to 10 are cross-sectional views illustrating a method of manufacturing the LED in FIG. 1.

Figure 4:
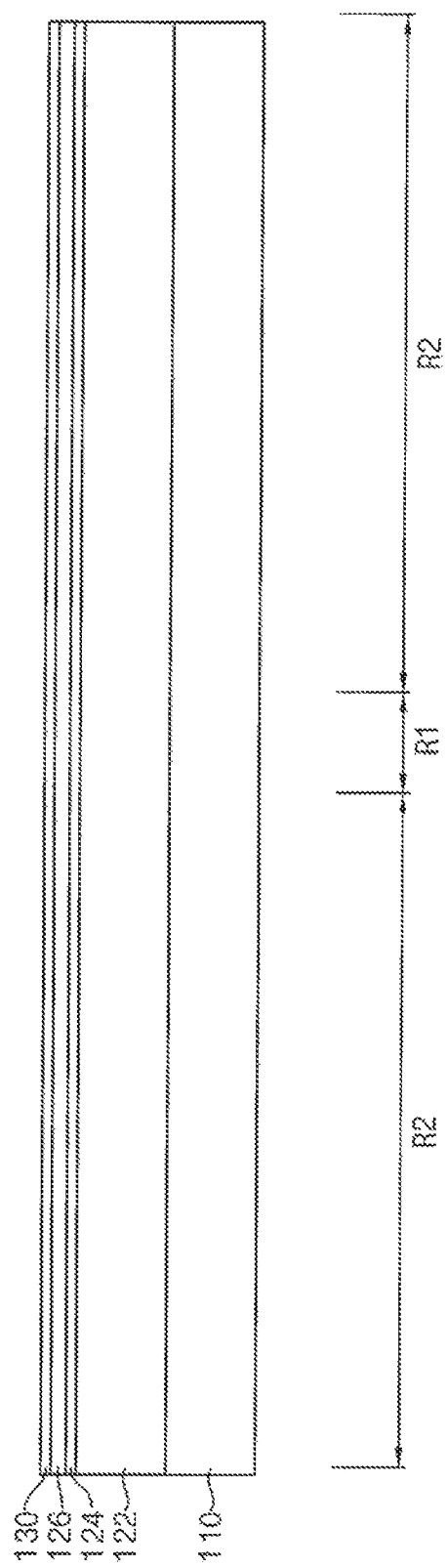
FIGS. 4 to 10 are cross-sectional views illustrating a method of manufacturing the LED in FIG. 1.

Referring to FIG. 4, the first semiconductor layer 122, the activation layer 124, the second semiconductor layer 126 and the transparent electrode 130 may be sequentially formed on the growth substrate 110.

Figure 5:
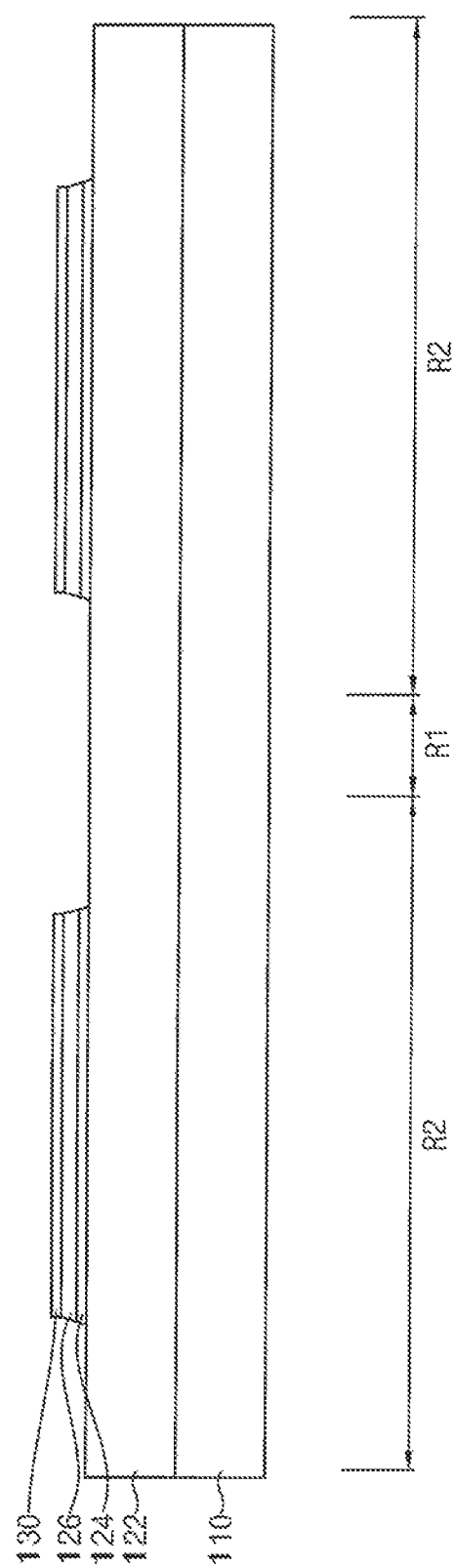

Referring to FIG. 5, the transparent electrode 130, the second semiconductor layer 126 and the activation layer 124 may be etched to divide the light emitting structure 120 into the first region R1 and the second region R2. Thus, the upper surface of the first semiconductor layer 122 in the first region R1 may be exposed.

Figure 6:
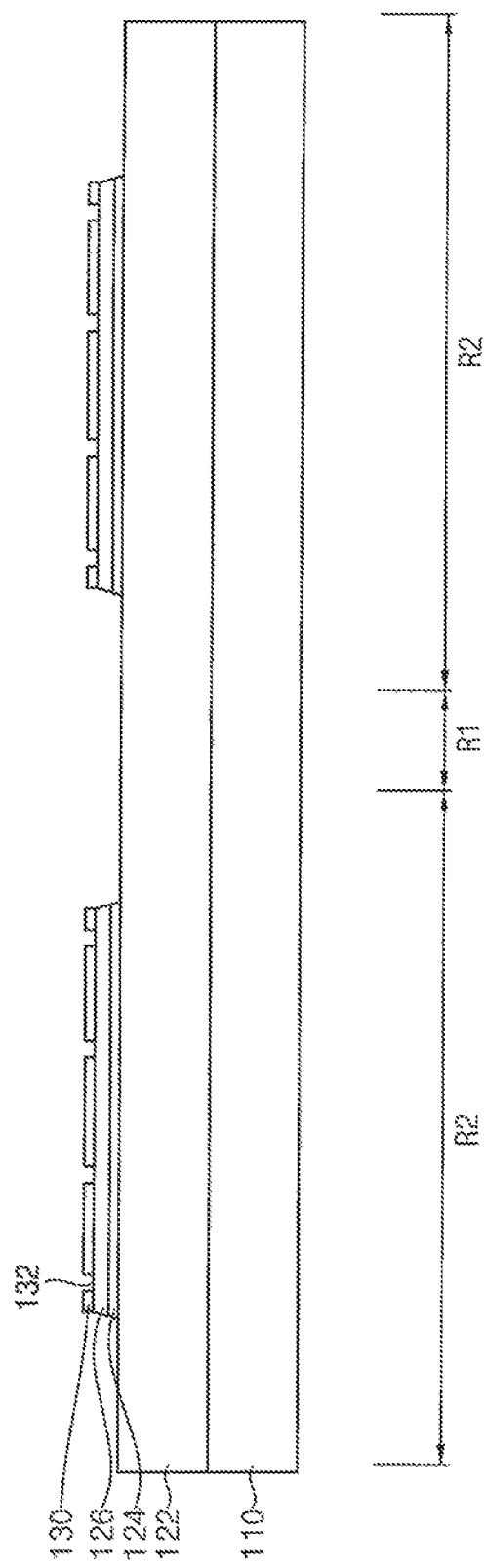

Referring to FIG. 6, the transparent electrode 130 may be partially removed to form the at least one first opening 132. The transparent electrode 130 may be removed by a wet etching process or a dry etching process. Thus, the upper surface of the second semiconductor layer 126 may be partially exposed through the first opening 132.

Figure 7:
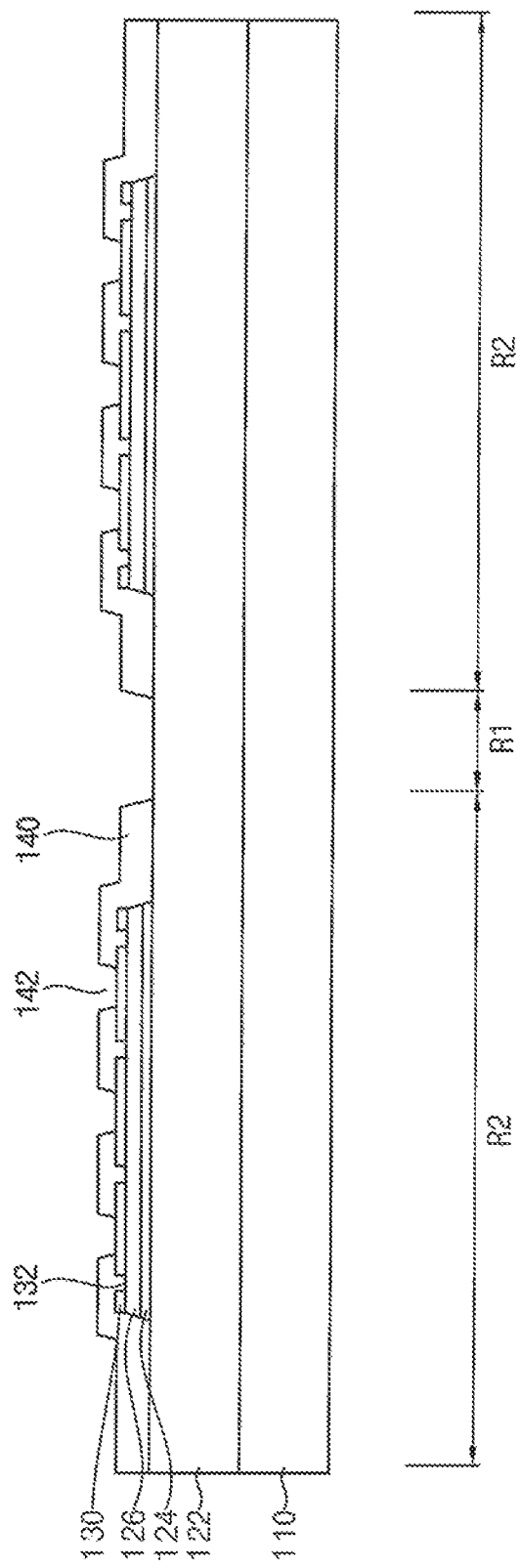

Referring to FIG. 7, the first insulation layer 140 may be formed on the upper surface of the transparent electrode 130 to fill the first opening 132 with the first insulation layer 140. The first insulation layer 140 may then be etched to form the first contact holes 142 configured to expose the upper surface of the transparent electrode 130.

Figure 8:
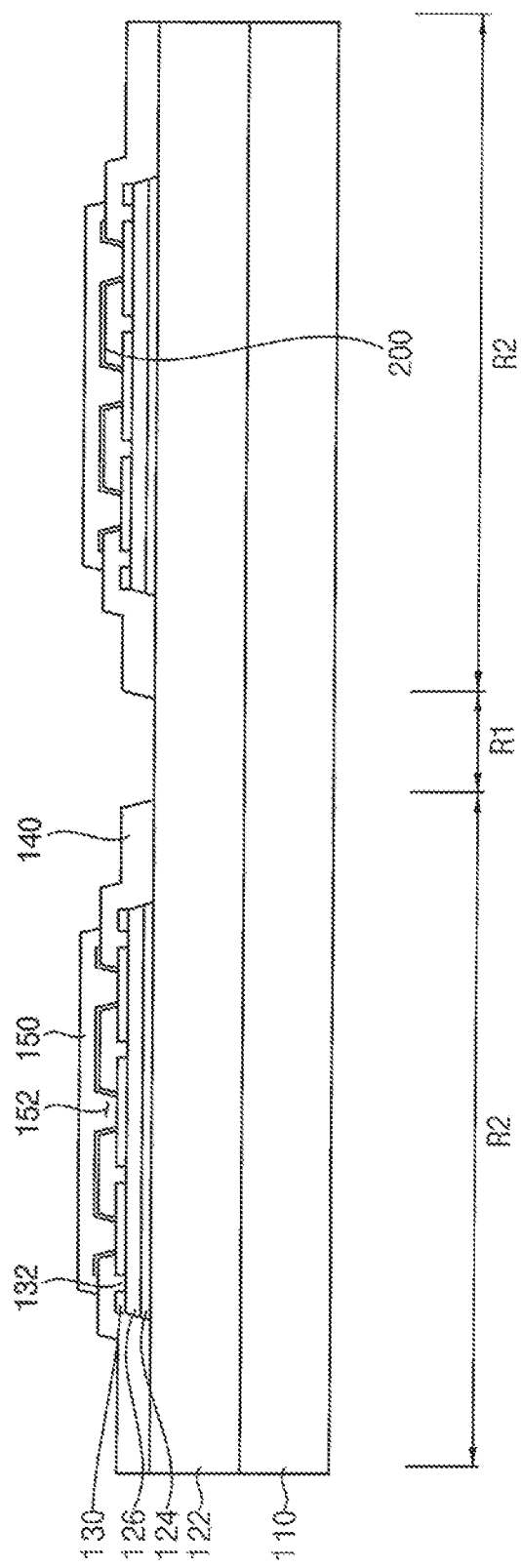

Referring to FIG. 8, the first electrode 150 may be formed on the upper surface of the first insulation layer 140 to fill the first contact holes 142 with the first contacts 152. Additionally, the adhesive layer 200 may be formed between the first insulation layer 140 and the first electrode 150.

Figure 9:
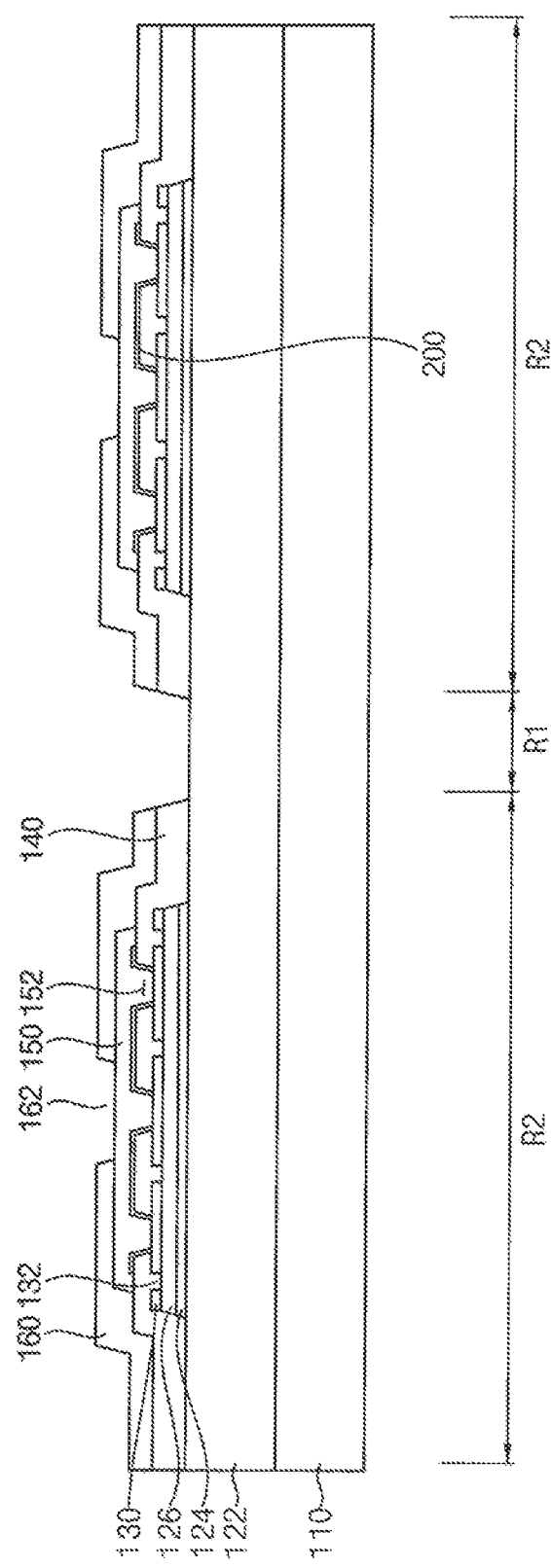

Referring to FIG. 9, the second insulation layer 160 may be formed on the upper surface of the first electrode 150. The second insulation layer 160 may then be etched to form the second contact holes 162 configured to partially expose the first electrode 150.

Figure 10:
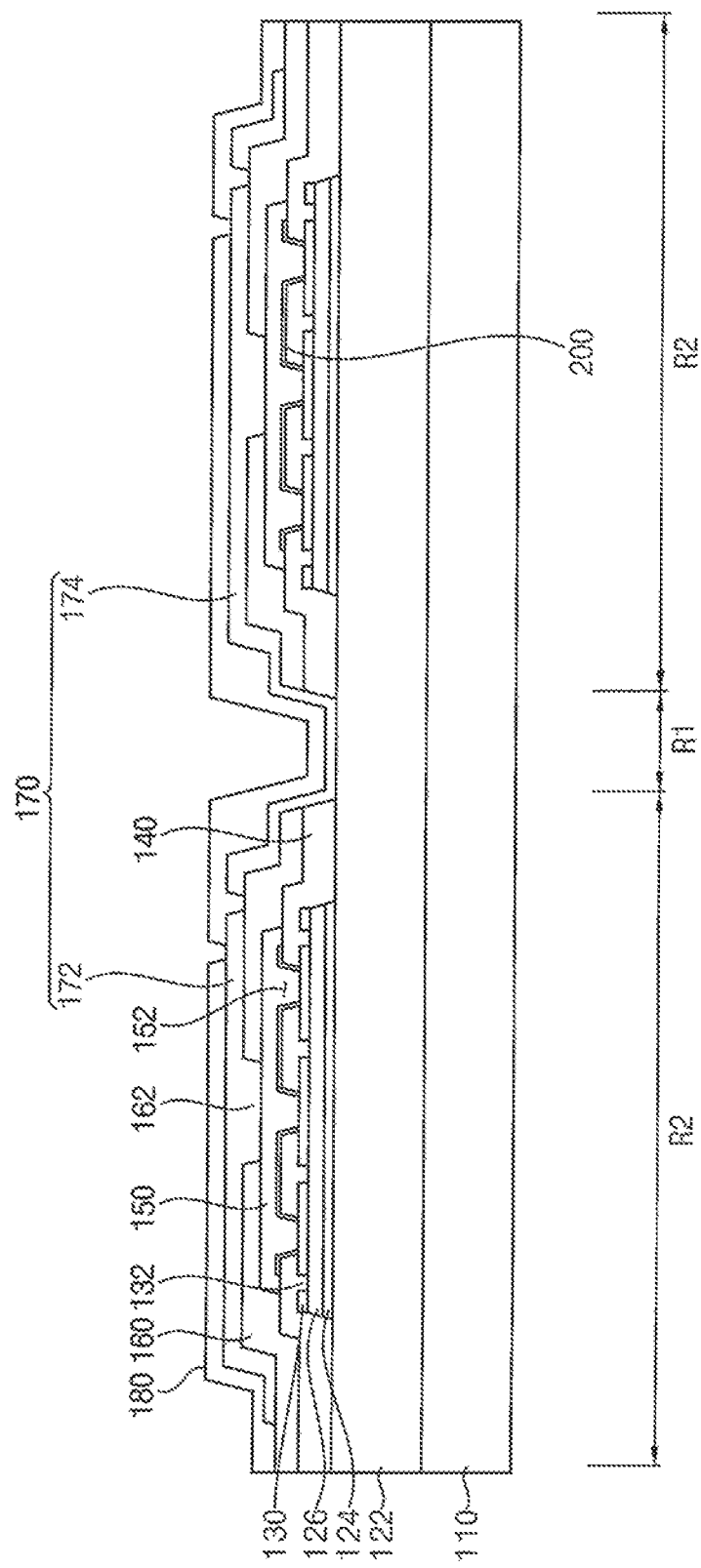

Referring to FIG. 10, the second electrode 170 may be formed on the upper surface of the second insulation layer 160. The second electrode 170 may include the first electrode layer 172 and the second electrode layer 174 electrically isolated from each other.

The third insulation layer 180 may be formed on the upper surface of the second electrode 170. The third insulation layer 180 may then be etched to form the openings configured to partially expose the second electrode 170. The conductive bump 190 may be formed on the upper surface of the second electrode 170 exposed through the opening of the third insulation layer 180 to complete the flip-chip type LED 100 in FIG. 1. Additionally, the barrier layer 192 may be formed between the conductive bump 190 and the second electrode 170.

Figure 11:
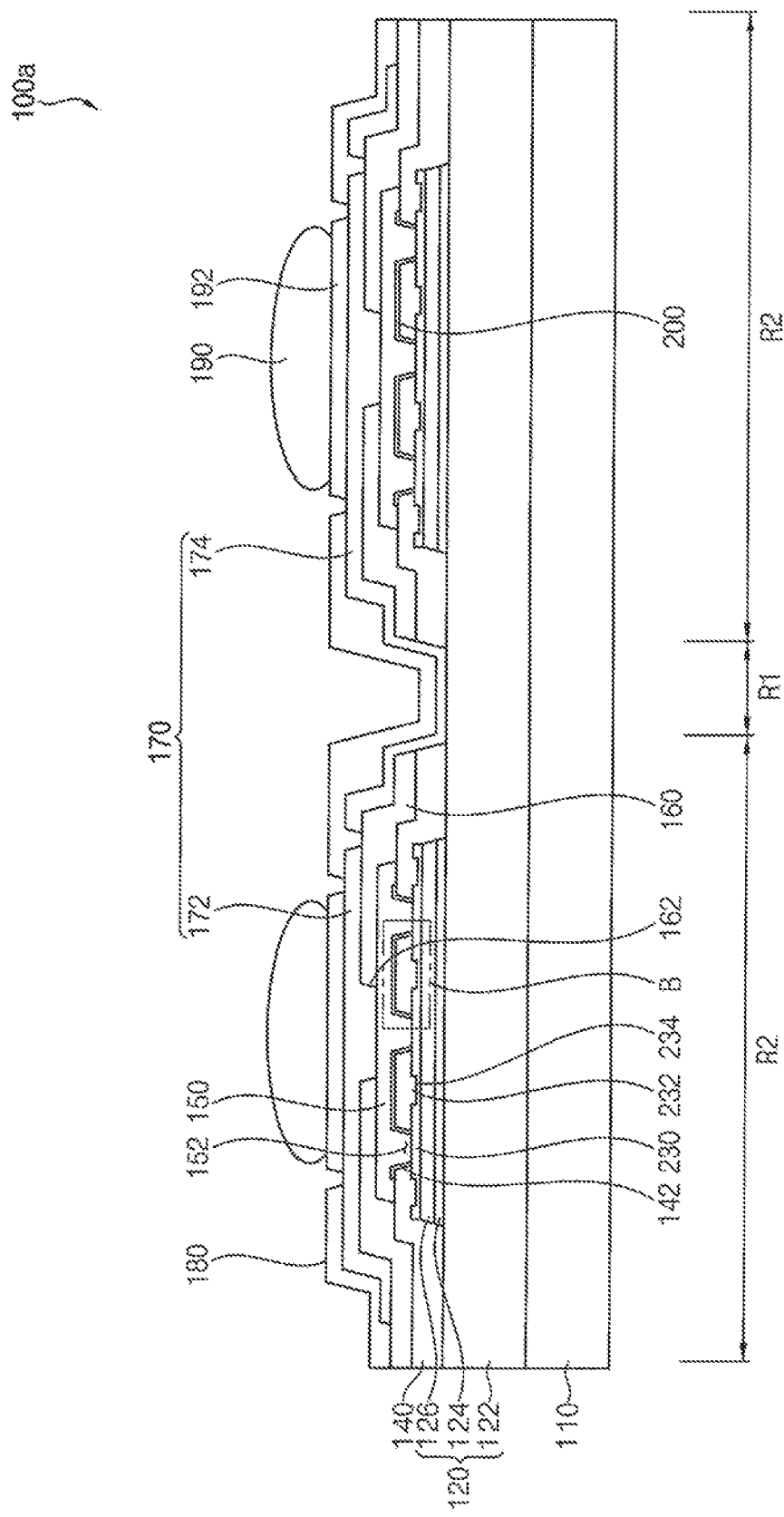
FIG. 11 is a cross-sectional view illustrating a light emitting device (LED) according to an embodiment.
Figure 12:
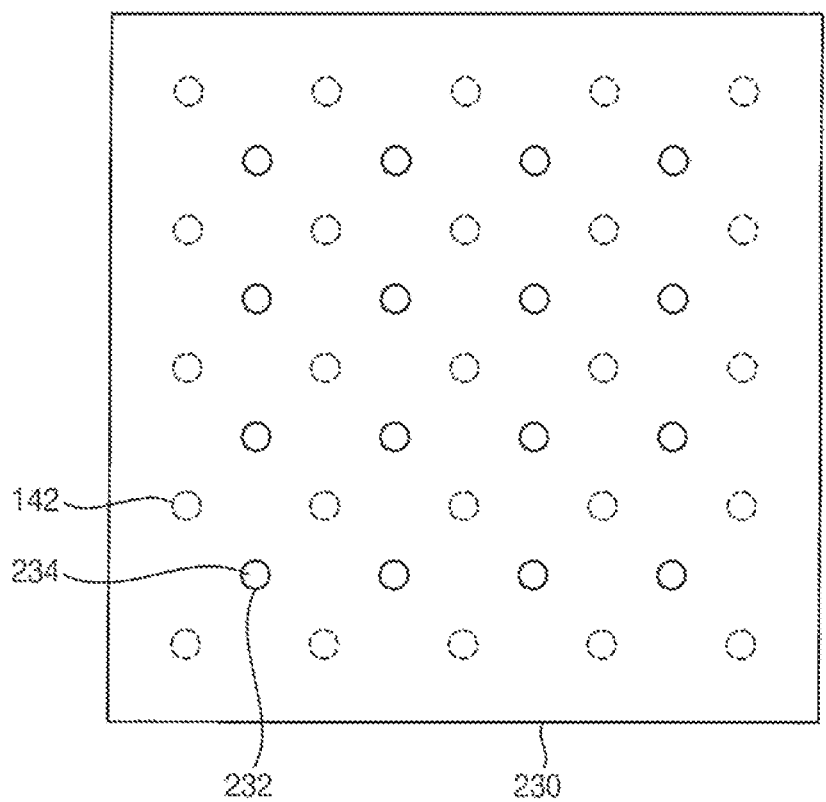
FIG. 12 is a plan view illustrating a transparent electrode of the LED in FIG. 11.
Figure 13:
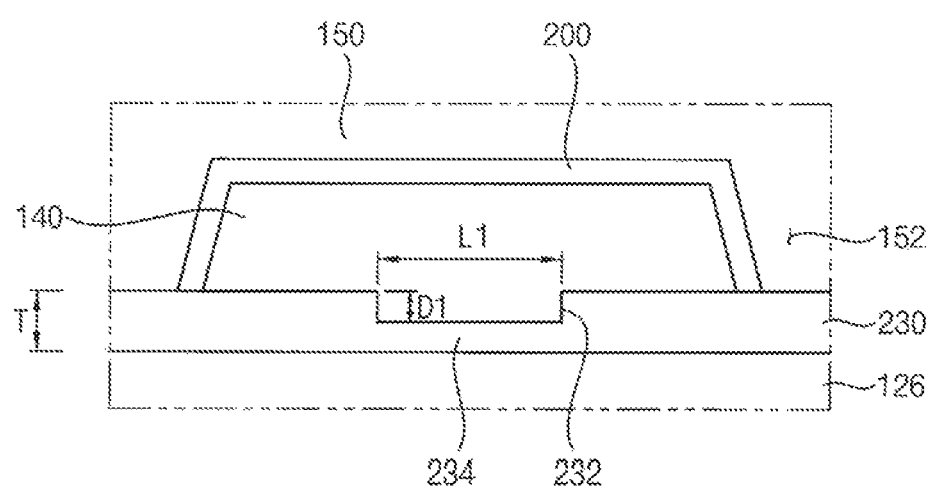
FIG. 13 is an enlarged cross-sectional view of a portion "B" in FIG. 11.

FIG. 11 is a cross-sectional view illustrating a light emitting device (LED) in accordance with example embodiments, FIG. 12 is a plan view illustrating a transparent electrode of the LED in FIG. 11, and FIG. 13 is an enlarged cross-sectional view of a portion "B" in FIG. 11.

An LED 100a of example embodiments may include elements substantially the same as those of the LED 100 in FIG. 1 except for a transparent electrode. Thus, the same reference numerals may refer to the same elements and any further illustrations with respect to the same elements may be omitted herein for brevity.

Referring to FIGS. 11 to 13, a transparent electrode 230 of example embodiments may include at least one second opening 232. The second opening 232 may be formed to extend from the upper surface of the transparent electrode 230 to a depth that is above the lower surface of the transparent electrode 230. That is, the second opening 232 may not be formed to extend through the entirety of the transparent electrode 230. Thus, a connection 234 as a part of the transparent electrode 230 may exist in (i.e., at the bottom of) the second opening 232. That is, the second opening 232 may have a partially opened structure. In contrast, the connection 234 may be configured to cover the upper surface of the second semiconductor layer 126 so that the upper surface of the second semiconductor layer 126 may not be exposed through the second opening 232. In example embodiments, the second opening 232 may have the arrangement in FIG. 2A, FIG. 2B or FIG. 2C.

The second opening 232 may have a depth D1 less than the thickness T of the transparent electrode 230 as shown in FIG. 13. That is, the depth D1 of the second opening 232 may be smaller than the depth D of the first opening 132. Further, the second opening 232 may have a diameter L1 of about 5,000/15 times to about 10,000/15 times the thickness T of the transparent electrode 230. In other words, a ratio of the diameter L1 of the second opening 232 to the thickness T of the transparent electrode 230 may be about 5,000:15 to about 10,000:15. Particularly, the diameter L1 of the second opening 232 may be longer than the diameter L of the first opening 132.

Because the depth D1 of the second opening 232 may be smaller than the depth D of the first opening 132 and the diameter L1 of the second opening 232 may be longer than the diameter L of the first opening 132, the second opening 232 may have a volume V1 substantially the same as the volume V of the first opening 132. Thus, the transparent electrode 230 of example embodiments may have a volume substantially the same as the volume of the transparent electrode 130 in FIG. 1 so that the transparent electrode 230 in FIG. 11 may have a low light absorptivity substantially similar to the low light absorptivity of the transparent electrode 130 in FIG. 1. As a result, the LED 100a of example embodiments may also have the improved light extraction efficiency.

In example embodiments, the connection 234 may have an area substantially the same as an area of the second opening 232. In other words, a cross-sectional area of the connection 234 may be substantially equal to a cross-sectional area of the second opening 232. Further, the connection 234 may have a thickness T1 obtained by subtracting the depth D1 of the second opening 232 from the thickness T of the transparent electrode 230. The thickness T1 of the connection 234 may be about 5/15 times to about 10/15 times the thickness T of the transparent electrode 230.

In other words, a ratio of the thickness T1 of the connection 234 to the thickness T of the transparent electrode 230 may be about 5:15 to about 10:15. The connection 234 may be configured to electrically connect portions of the transparent electrode 230, which may be configured to surround the second opening 232, with each other. That is, the transparent electrode 230 of example embodiments may not have an electrically isolated portion due to the presence of the connection 234. Thus, the transparent electrode 230 of example embodiments may have a current spreading substantially the same as the transparent electrode without the opening. As a result, the LED 100a of example embodiments may have a forward current Vf substantially the same as the forward current of the LED without the opening.

A method of manufacturing the LED 100a in accordance with example embodiments may include processes substantially the same as those illustrated with reference to FIGS. 4 to 10 except for a process for forming the second opening 232 in the transparent electrode 230. Thus, any further illustrations with respect to the method of manufacturing the LED 100a may be omitted herein for brevity.

Figure 14:
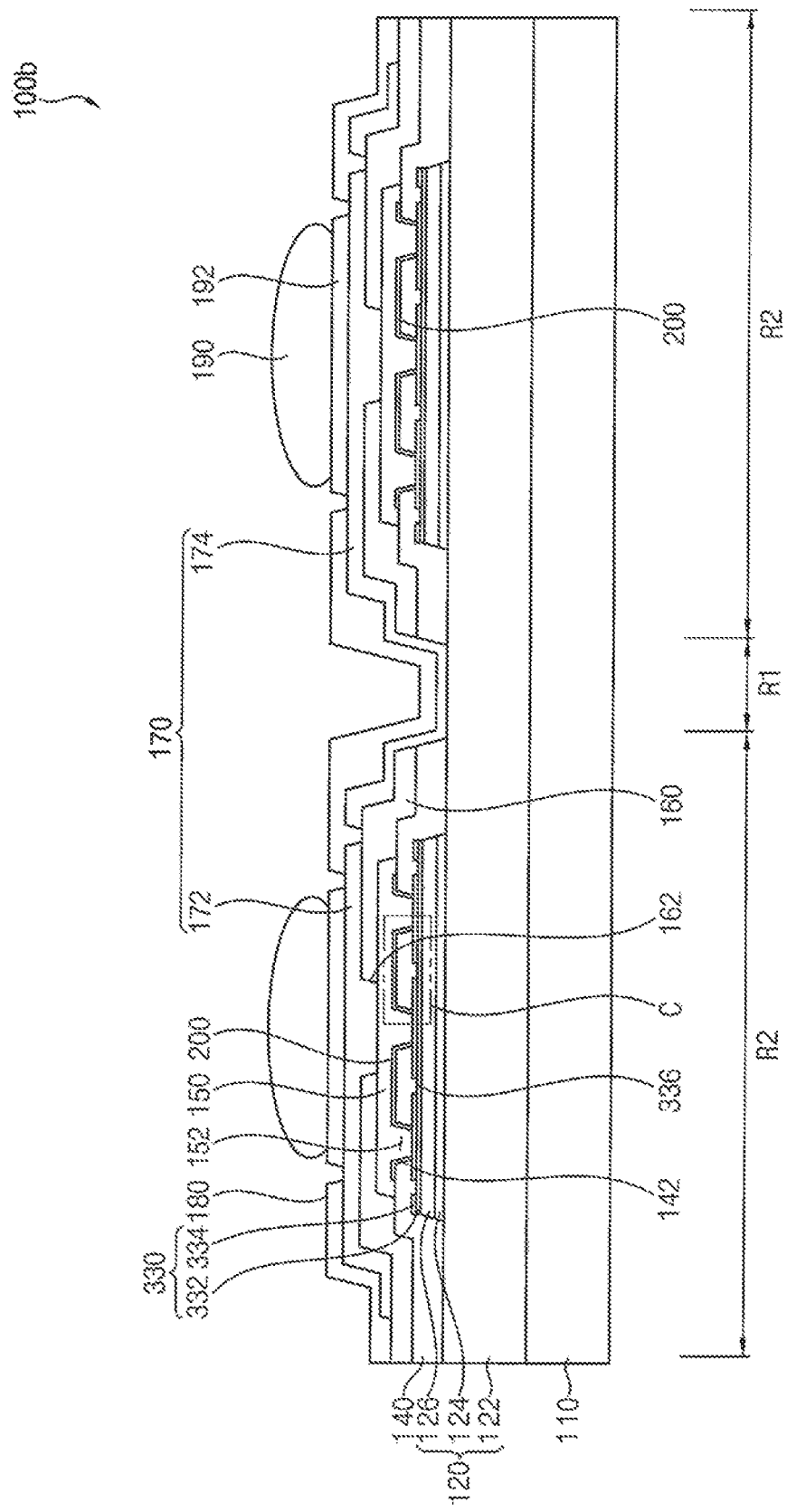
FIG. 14 is a cross-sectional view illustrating a light emitting device (LED) according to an embodiment.
Figure 15:
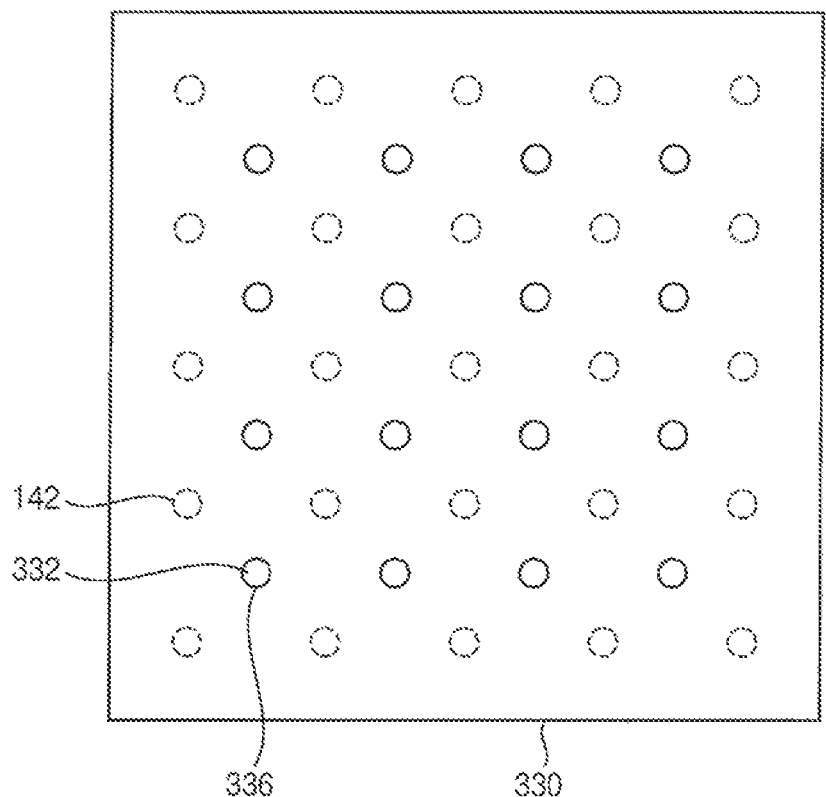
FIG. 15 is a plan view illustrating a transparent electrode of the LED in FIG. 14.
Figure 16:
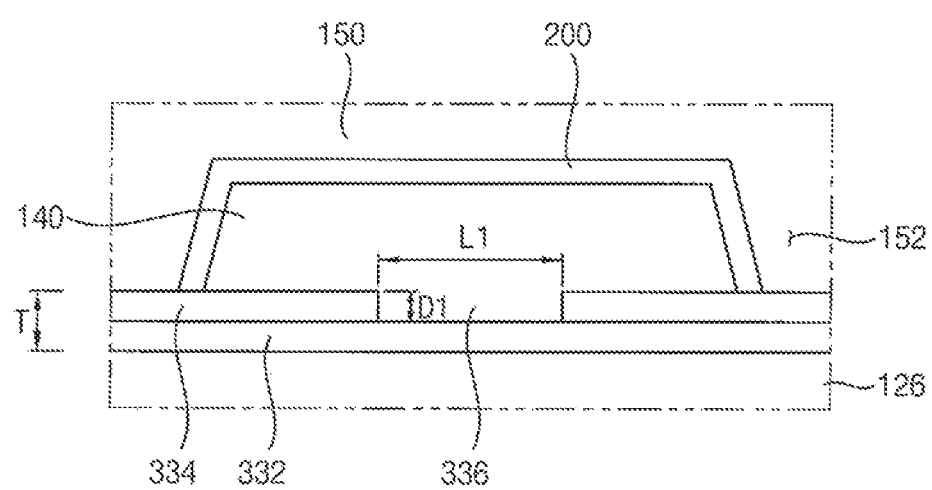
FIG. 16 is an enlarged cross-sectional view of a portion "C" in FIG. 14.

FIG. 14 is a cross-sectional view illustrating a light emitting device (LED) in accordance with example embodiments, FIG. 15 is a plan view illustrating a transparent electrode of the LED in FIG. 14, and FIG. 16 is an enlarged cross-sectional view of a portion "C" in FIG. 14.

An LED 100b of example embodiments may include elements substantially the same as those of the LED 100a in FIG. 11 except for a transparent electrode. Thus, the same reference numerals may refer to the same elements and any further illustrations with respect to the same elements may be omitted herein for brevity.

Referring to FIGS. 14 to 16, a transparent electrode 330 of example embodiments may include a lower transparent electrode layer 332 and an upper transparent electrode layer 334 formed on the lower transparent electrode layer 332.

The upper transparent electrode layer 334 may include a second opening 336 having a structure substantially the same as that of the second opening 232 in FIG. 11. An upper surface of the lower transparent electrode layer 332 may be exposed through the second opening 336. Thus, any further illustrations with respect to the second opening 336 of the upper transparent electrode layer 334 may be omitted herein for brevity. The second opening 336 may have the arrangement in FIG. 2A, FIG. 2B or FIG. 2C.

The lower transparent electrode layer 332 may include a material having a conductivity stronger than a transparency. For example, the lower transparent electrode layer 332 may include ITO. In contrast, the upper transparent electrode layer 334 may include a material having a transparency stronger than a conductivity. For example, the upper transparent electrode layer 334 may include zinc oxide (ZnO).

A method of manufacturing the LED 100b in accordance with example embodiments may include processes substantially the same as those illustrated with reference to FIGS. 4 to 10 except for a process for forming the transparent electrode 330 including the upper and lower transparent electrode layers 332 and 334. Thus, any further illustrations with respect to the method of manufacturing the LED 100b may be omitted herein for brevity.

Figure 17:
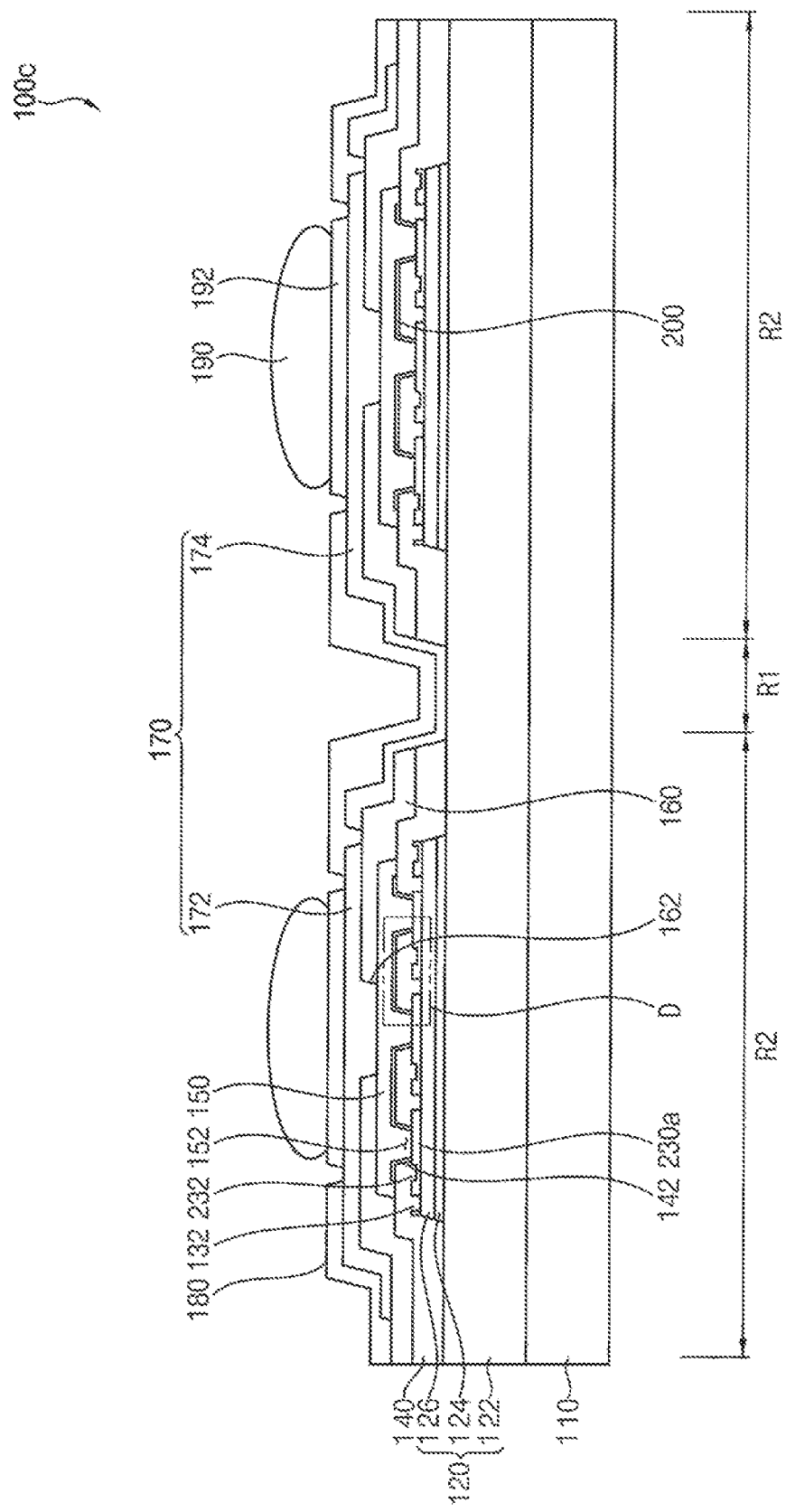
FIG. 17 is a cross-sectional view illustrating a light emitting device (LED) according to an embodiment.
Figure 18:
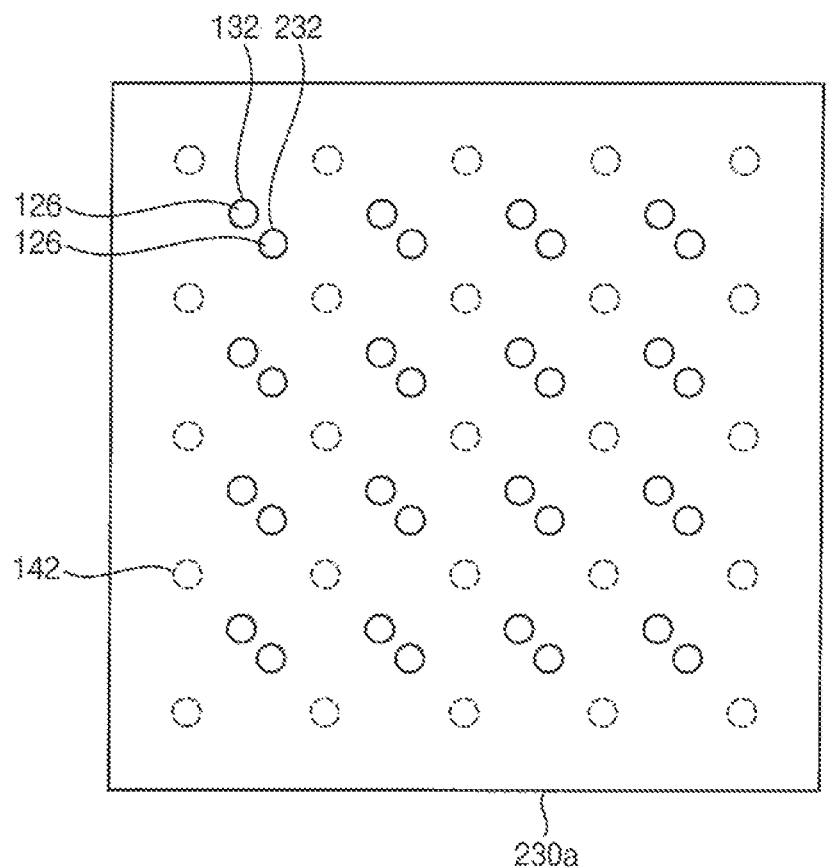
FIG. 18 is a plan view illustrating a transparent electrode of the LED in FIG. 17.
Figure 19:
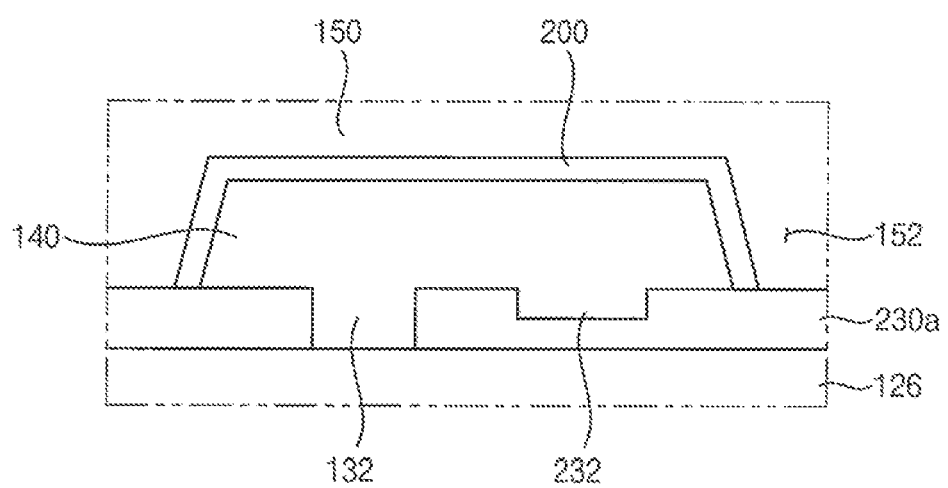
FIG. 19 is an enlarged cross-sectional view of a portion "D" in FIG. 17.

FIG. 17 is a cross-sectional view illustrating a light emitting device (LED) in accordance with example embodiments, FIG. 18 is a plan view illustrating a transparent electrode of the LED in FIG. 17, and FIG. 19 is an enlarged cross-sectional view of a portion "D" in FIG. 17.

An LED 100c of example embodiments may include elements substantially the same as those of the LED 100a in FIG. 11 except for a transparent electrode. Thus, the same reference numerals may refer to the same elements and any further illustrations with respect to the same elements may be omitted herein for brevity.

Referring to FIGS. 17 to 19, a transparent electrode 230a of example embodiments may include at least one first opening 132 and at least one second opening 232. Particularly, the first opening 132 may have a volume substantially the same as that of the second opening 232.

The first opening 132 in FIG. 17 may have a structure substantially the same as that of the first opening 132 in FIG. 1. The second opening 232 in FIG. 17 may have a structure substantially the same as that of the second opening 232 in FIG. 11. Thus, any further illustrations with respect to the first opening 132 and the second opening 232 may be omitted herein for brevity. The first and second openings 132 and 232 may have the arrangement in FIG. 2A, FIG. 2B or FIG. 2C.

A method of manufacturing the LED 100c in accordance with example embodiments may include processes substantially the same as those illustrated with reference to FIGS. 4 to 10 except for a process for forming the transparent electrode 230a including the first and second openings 132 and 232. Thus, any further illustrations with respect to the method of manufacturing the LED 100c may be omitted herein for brevity.

Figure 20:
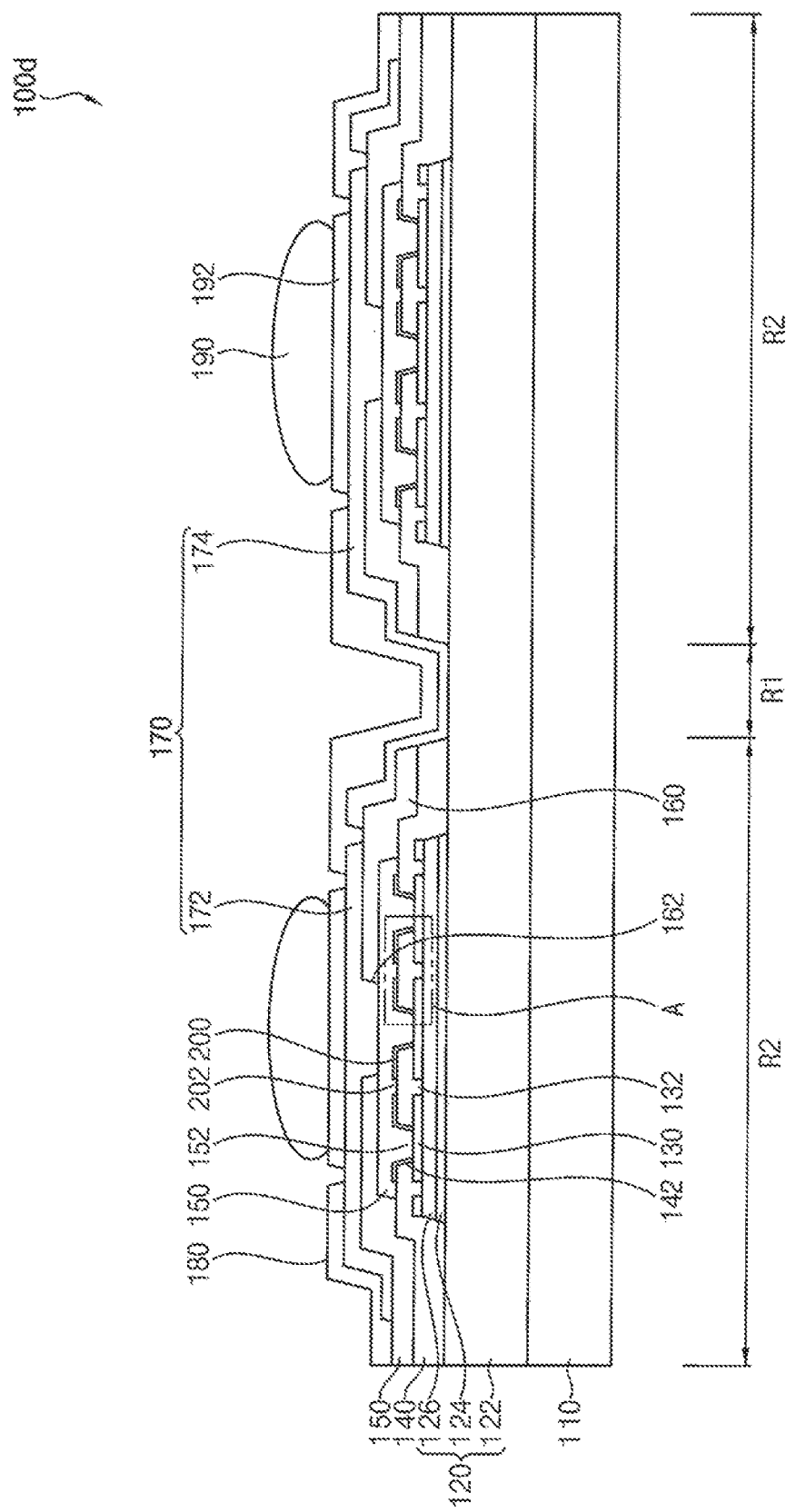
FIG. 20 is a cross-sectional view illustrating a light emitting device (LED) according to an embodiment.

FIG. 20 is a cross-sectional view illustrating a light emitting device (LED) in accordance with example embodiments.

An LED 100d of example embodiments may include elements substantially the same as those of the LED 100 in FIG. 1 except for an adhesive layer. Thus, the same reference numerals may refer to the same elements and any further illustrations with respect to the same elements may be omitted herein for brevity.

Referring to FIG. 20, in order to reduce a light absorptivity of an adhesive layer 200, the adhesive layer 200 may include an opening 202. The opening 202 may be formed through the adhesive layer 200. Thus, the upper surface of the first insulation layer 140 and the lower surface of the first electrode 150 may be exposed through the opening 202. The opening 202 of the adhesive layer 200 may have a diameter substantially the same as the diameter L of the first opening 132 of the transparent electrode 130. Alternatively, the diameter of the opening 202 may be longer or shorter than the diameter L of the first opening 132 of the transparent electrode 130.

Evaluating a Forward Voltage and a Reflecting Ratio of LEDs

Forward voltages and reflecting ratios of LEDs, which may include a transparent electrode having a thickness of about 15 nm, may be measured with changing a diameter and a depth of an opening. Measured forward voltages and reflecting ratios may be shown in the following Table.

| Diameter of opening (μm) | Thickness of connection (nm) | Forward voltage (Vf) | Reflecting ratio (%) |
|---|---|---|---|
| 0 | 15 | 2.767 | 0.0000 |
| 5 | 0 | 2.773 | 0.0217 |
| 5 | 5 | 2.767 | 0.0140 |
| 5 | 6 | 2.767 | 0.0126 |
| 5 | 7 | 2.767 | 0.0112 |
| 5 | 8 | 2.767 | 0.0098 |
| 5 | 9 | 2.767 | 0.0084 |
| 5 | 10 | 2.767 | 0.0070 |
| 6 | 5 | 2.767 | 0.0172 |

-continued

| Diameter of opening (μm) | Thickness of connection (nm) | Forward voltage (Vf) | Reflecting ratio (%) |
|---|---|---|---|
| 7 | 5 | 2.767 | 0.0210 |
| 8 | 5 | 2.767 | 0.0253 |
| 9 | 5 | 2.767 | 0.0302 |
| 10 | 5 | 2.767 | 0.0406 |
| 10 | 7 | 2.767 | 0.0325 |
| 10 | 10 | 2.767 | 0.0204 |

As shown in the Table, when the thickness of the connection is about 15 nm, i.e., the opening is not formed in the transparent electrode, it can be noted that the forward voltage is about 2.767V and the reflecting ratio is about 0.

When the first opening in FIG. 1 is formed at the transparent electrode, it can be noted that the reflecting ratio is increased to about 0.0217%. However, it can be noted the forward voltage is also slightly increased from about 2.767V to about 2.773V. As mentioned above, because the portions of the transparent electrode configured to surround the first opening are not electrically connected with each other through the first opening, the current spreading of the transparent electrode with the first opening is slightly decreased compared to the current spreading of the transparent electrode without the first opening so that the forward current is slightly increased. Because the thickness of the transparent electrode is about 15 nm to about 50 nm, the first opening has the diameter of about 5,000/50 times to about 5,000/15 times the thickness of the transparent electrode. In other words, a ratio of the diameter of the first opening to the thickness of the transparent electrode is about 5,000:50 to about 5,000:15.

When the second opening in FIG. 10 is formed at the transparent electrode, the portions of the transparent electrode configured to surround the second opening are electrically connected with each other through the connection. Thus, the current spreading of the transparent electrode with the second opening is substantially similar to the current spreading of the transparent electrode without the second opening so that it can be noted that the forward current is maintained. Thus, the diameter of the second opening is about 5,000/50 times to about 10,000/15 times the thickness of the transparent electrode. The thickness of the connection is about 5/15 times to about 10/15 times the thickness of the transparent electrode.

Further, when the volume of the second opening is smaller than the volume of the first opening, it can be noted that the reflecting ratio of the transparent electrode with the second opening is slightly lower than the reflecting ratio of the transparent electrode with the first opening. However, when the volume of the second opening is no less than the volume of the first opening, it can be noted that the reflecting ratio of the transparent electrode with the second opening is no less than the reflecting ratio of the transparent electrode with the first opening. That is, when the volume of the second opening is substantially the same as the volume of the first opening, it can be noted that the reflecting ratio of the transparent electrode with the second opening is substantially the same as the reflecting ratio of the transparent electrode with the first opening.

According to example embodiments, the opening of the transparent electrode may function to reduce a volume of the transparent electrode by a volume of the opening. Thus, the transparent electrode may have a low light absorptivity to provide the LED with improved light extraction efficiency. Particularly, when the opening may have a partially opened structure, portions of the transparent electrode at both sides of the opening may be connected with each other through a connection. Therefore, the LED may have a low forward voltage with the transparent electrode having the low light absorptivity.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the disclosure. Accordingly, all such modifications are intended to be included within the scope of the disclosure as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A light emitting device (LED) comprising:
a light emitting structure comprising a first semiconductor layer, an activation layer and a second semiconductor layer sequentially stacked;
a transparent electrode formed on an upper surface of the second semiconductor layer, the transparent electrode having at least one opening;
a first insulation layer formed on an upper surface of the transparent electrode to fill the at least one opening;
a first electrode formed on an upper surface of the first insulation layer, the first electrode comprising a contact extending through the first insulation layer, the contact being connected with the transparent electrode;
a second insulation layer formed on an upper surface of the first electrode; and
a second electrode formed on an upper surface of the second insulation layer, the second electrode being electrically connected with the first semiconductor layer,
wherein the at least one opening comprises a first opening having a fully opened structure, the first opening having a depth substantially equal to a thickness of the transparent electrode to expose the upper surface of the second semiconductor layer.

2. The LED of claim 1, wherein the first insulation layer contacts and covers an entire exposed portion of the upper surface of the second semiconductor layer that is exposed by the at least one opening.

3. The LED of claim 1, wherein a ratio of a diameter of the first opening to the thickness of the transparent electrode is in a range from 5,000:50 to 5,000:15.

4. The LED of claim 1, wherein the at least one opening further comprises a second opening having a partially opened structure, the second opening having a depth less than the thickness of the transparent electrode, and
wherein the transparent electrode comprises a connection arranged on a bottom surface of the second opening to connect portions of the transparent electrode around the second opening with each other.

5. The LED of claim 4, wherein the second opening has a volume substantially equal to a volume of the first opening.

6. The LED of claim 1, wherein the at least one opening comprises a second opening having a partially opened structure, the second opening having a depth less than a thickness of the transparent electrode, and
wherein the transparent electrode comprises a connection arranged on a bottom surface of the second opening to connect portions of the transparent electrode around the second opening with each other.

7. The LED of claim 6, wherein a cross-sectional area of the connection is substantially equal to a cross-sectional area of the second opening.

8. The LED of claim 6, wherein a ratio of a diameter of the second opening to the thickness of the transparent electrode is in a range from 5,000:15 to 10,000:15, and
wherein a ratio of a thickness of the connection to the thickness of the transparent electrode is in a range from 5:15 to 10:15.

9. The LED of claim 6, wherein the transparent electrode comprises:
a lower transparent electrode layer formed on the upper surface of the second semiconductor layer; and
an upper transparent electrode layer formed on an upper surface of the lower transparent electrode layer, the upper transparent electrode layer having the second opening.

10. The LED of claim 1, wherein the first insulation layer comprises a plurality of contact holes in which the contact is formed, and
wherein the at least one opening is arranged between adjacent contact holes among the plurality of contact holes.

11. The LED of claim 1, further comprising an adhesive layer interposed between the first insulation layer and the first electrode.

12. The LED of claim 11, wherein the adhesive layer has at least one second opening configured to expose the upper surface of the first insulation layer and a lower surface of the first electrode.

13. The LED of claim 1, wherein the light emitting structure comprises:
a first region in which the upper surface of the first semiconductor layer is exposed; and
a second region including the first semiconductor layer, the activation layer and the second semiconductor layer.

14. The LED of claim 13, further comprising a growth substrate arranged under the first semiconductor layer, wherein the second electrode comprises a first electrode layer configured to make electrical contact with the first semiconductor layer exposed in the first region and a second electrode layer electrically connected to the first electrode.

15. A light emitting device (LED) comprising:
a first semiconductor layer;
an activation layer formed on an upper surface of the first semiconductor layer;
a second semiconductor layer formed on an upper surface of the activation layer;
a transparent electrode formed on an upper surface of the second semiconductor layer, the transparent electrode having at least one opening, the at least one opening having a depth through which the upper surface of the second semiconductor layer is not exposed;
a first insulation layer formed on an upper surface of the transparent electrode to fill the at least one opening;
a first electrode formed on an upper surface of the first insulation layer, the first electrode comprising a contact extending through the first insulation layer, the contact being connected with the transparent electrode;
a second insulation layer formed on an upper surface of the first electrode; and
a second electrode formed on an upper surface of the second insulation layer, the second electrode being electrically connected with the first semiconductor layer,
wherein a ratio of a diameter of the at least one opening to a thickness of the transparent electrode is in a range from 5,000:15 to 10,000:15,
wherein the at least one opening comprises a first opening having a fully opened structure, the first opening having a depth substantially equal to a thickness of the transparent electrode to expose the upper surface of the second semiconductor layer.

16. The LED of claim 15, wherein the transparent electrode comprises a connection arranged on a bottom surface of the at least one opening to connect portions of the transparent electrode around the at least one opening with each other.

17. The LED of claim 16, wherein a ratio of a thickness of the connection to the thickness of the transparent electrode is in a range from 5:15 to 10:15.

18. The LED of claim 15, wherein the transparent electrode comprises:
a lower transparent electrode layer formed on the upper surface of the second semiconductor layer; and
an upper transparent electrode layer formed on an upper surface of the lower transparent electrode layer, the upper transparent electrode layer having the at least one opening.

19. The LED of claim 15, further comprising an adhesive layer interposed between the first insulation layer and the first electrode.

20. The LED of claim 19, wherein the adhesive layer has at least one second opening configured to expose the upper surface of the first insulation layer and a lower surface of the first electrode.

* * * * *